(12) United States Patent
Frith et al.

(10) Patent No.: US 6,952,176 B2
(45) Date of Patent: Oct. 4, 2005

(54) DIGITAL-TO-ANALOGUE CONVERTER CIRCUITS

(75) Inventors: Peter J. Frith, Edinburgh (GB); John L. Pennock, Midlothian (GB)

(73) Assignee: Wolfson Microelectronics plc, Edinburgh (GB)

( * ) Notice: Subject to any disclaimer, the term of this patent is extended or adjusted under 35 U.S.C. 154(b) by 10 days.

(21) Appl. No.: 10/770,387

(22) Filed: Feb. 4, 2004

(65) Prior Publication Data
US 2005/0122245 A1    Jun. 9, 2005

(30) Foreign Application Priority Data
Dec. 5, 2003    (GB) .................................. 0328301

(51) Int. Cl.[7] .......................... H03M 3/00; H03M 1/66
(52) U.S. Cl. ....................................... 341/143; 341/150
(58) Field of Search ............................... 341/143, 150, 341/172

(56) References Cited

U.S. PATENT DOCUMENTS

| | | | | |
|---|---|---|---|---|
| 4,574,250 A | * | 3/1986 | Senderowicz | 330/258 |
| 4,633,425 A | * | 12/1986 | Senderowicz | 708/819 |
| 4,920,325 A | * | 4/1990 | Nicollini et al. | 333/173 |
| 4,988,900 A | * | 1/1991 | Fensch | 327/337 |

FOREIGN PATENT DOCUMENTS

GB    2 388 724 A    11/2003

\* cited by examiner

*Primary Examiner*—Howard L. Williams
(74) *Attorney, Agent, or Firm*—Dickstein Shapiro Morin & Oshinsky LLP

(57) ABSTRACT

This invention is generally concerned with digital-to-analogue converters and more particularly relates to techniques for reducing signal dependent loading of reference voltage sources used by these converters.

A differential switched capacitor digital-to-analogue (DAC) circuit (500) comprises first and second differential signal circuit portions (500a,b) for providing respective positive and negative signal outputs with respect to a reference level, and has first and second reference voltage inputs (112,114) for receiving respective positive and negative references. Each of said first and second circuit portions comprises an amplifier (102a,b) with a feedback capacitor (104a,b), a second capacitor (106a,b), and a switch (108a,b, 110a,b) to switchably couple said second capacitor to a selected one of said reference voltage inputs to charge the second capacitor and to said feedback capacitor to share charge with the feedback capacitor. The switch of said first circuit portion is further configured to connect said second capacitor (106a) of said first circuit portion to share charge with said feedback capacitor (104b) of said second circuit portion; and the switch of said second circuit portion is further configured to connect said second capacitor (106b) of said second circuit portion to share charge with said feedback capacitor (104a) of said first circuit portion. This enables the second capacitors to in effect be alternately pre-charged to positive and negative signal-dependent nodes so that, on average, signal dependent loading of the references is approximately constant.

11 Claims, 10 Drawing Sheets

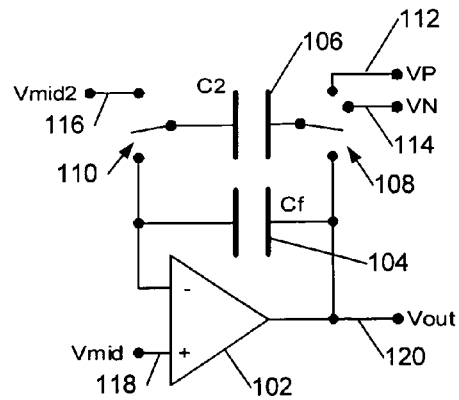
Figure 1a
(Prior Art)
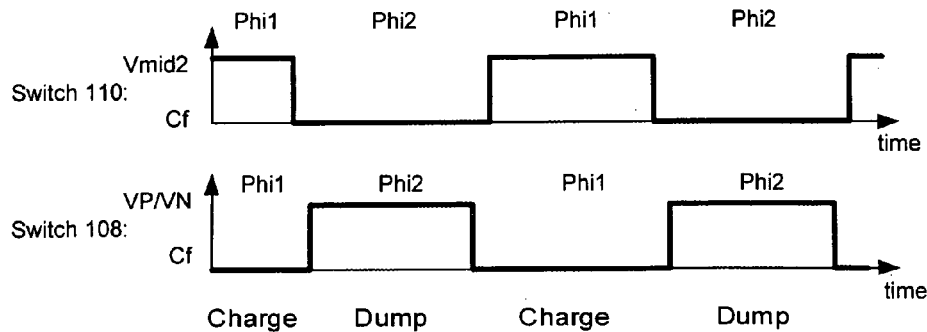
Figure 1b
| | Connected to: | |
|---|---|---|
| Switch | During Phi1 (Charge) | During Phi2 (Dump) |
| 110 | Vmid2 | Cf |
| 108 | VP/VN | Cf |
Figure 1c

DIGITAL-TO-ANALOGUE CONVERTER CIRCUITS

FIELD OF THE INVENTION

This invention is generally concerned with digital-to-analogue converters and more particularly relates to techniques for reducing signal dependent loading of reference voltage sources used by these converters.

BACKGROUND TO THE INVENTION

Digital-analogue conversion based on converting a delta-sigma digital representation of a signal into an analogue waveform is now a commonplace technique. In a simple delta-sigma digital-to-analogue converter a string of pulses is generated, with a pulse density dependent upon the digital value to be converted, and low-pass filtered. The technique is prevalent in many high-volume application areas, for example digital audio, where several channels of high quality relatively low frequency (audio frequency) signals are required. High quality in this context typically implies −100 dB THD (Total Harmonic Distortion) and 100 dB SNR (Signal to Noise Ratio). However, in such high-volume markets manufacturing cost is also very important.

In general, a digital-to-analogue converter requires positive and negative reference voltages to define the amplitude of the output signal. A digital-to-analogue converter draws some current from these reference voltage ports, and this current will generally be signal dependent.

These reference voltages are typically generated from a source of low but non-zero output impedance, for example by a power supply or buffer with a decoupling capacitor. The source will have a finite ESR (Equivalent Series Resistance), and there will be additional resistance between the source, the decoupling and the device due to the effects of resistive PCB tracking, package lead resistance, and bond wire resistance.

The result is that any signal-dependent current drawn by the DAC from the references causes a signal-dependent voltage ripple to appear on the reference voltages actually applied to the DAC. Since the DAC output signal is proportional to the reference voltage, this multiplies the ideal digital-to-analogue converter output by this ripple. The consequent modulation of the output signal is apparent as signal distortion, for example, generating harmonic distortion components with a sine wave signal.

Furthermore in a stereo or multi-channel system it is often uneconomic to supply a digital-to-analogue converter for each channel with a separate voltage reference supply, or even separate decoupling, PCB traces, or integrated circuit pins. In these situations the reference ripple caused by one channel's DAC can appear on the reference voltage for other DACs, modulating the outputs of these other DACs as well as its own output.

The invention described herein is directed to digital-to-analogue converter circuits intended to reduce or eliminate signal dependent reference currents. A digital-to-analogue converter design for which the reference currents are substantially independent of output signal should be capable of lower distortion for a given source impedance. Alternatively, for a given acceptable level of performance, the digital-to-analogue converter should be more tolerant of source impedance, so allowing a design engineer to reduce costs by specifying fewer or cheaper, lower quality external components.

Many delta-sigma digital-to-analogue converters use switched-capacitor techniques. FIG. 1a shows an example of a simple switched-capacitor DAC 100 suitable for use in a delta-sigma DAC system.

An operational amplifier 102 has a non-inverting input connected to a constant voltage $V_{mid}$ 118, typically ground. Operational amplifier 102 has an output 120 providing an output voltage $V_{out}$ and a feedback capacitor $C_f$ 104 is connected between the output and an inverting input of the operational amplifier. A second capacitor C2 106 is switchably connected across feedback capacitor 104 by means of switches 108 and 110. Switch 108 allows one plate of capacitor 106 to be connected either to $C_f$ 104 or to a positive reference voltage $V_P$ 112 or a negative reference voltage $V_N$ 114. Switch 110 allows the other plate of capacitor 106 to be connected either to feedback capacitor 104 or to a second constant voltage, $V_{mid2}$ 116.

In operation switches 108 and 110 are controlled respective by two-phase, preferably non-overlapping clocks supplied by a clock generator (not shown in FIG. 1). As shown in FIG. 1b, each of these clock signals comprises a charge phase Phi1 during which switch 110 is connected to $V_{mid2}$ and switch 108 is connected to either $V_P$ or $V_N$, and capacitor C2 106 is charged and a dump phase Phi2 during which switch 110 is connected to $C_f$ and switch 108 is connected to $C_f$, and the charge on capacitor C2 106 is shared with or dumped to the feedback capacitor $C_f$ 104. This clocking scheme can conveniently be represented by the table of FIG. 1c, reproduced below as Table 1a.

TABLE 1a

Switch positions versus clock phase for the circuit of FIG. 1a

| Switch | Connected to: During Phi1 (Charge) | During Phi2 (Dump) |
|---|---|---|
| 110 | Vmid2 | Cf |
| 108 | VP/VN | Cf |

Henceforth clocking schemes for subsequent circuits will likewise be represented by tables along the lines of table 1a, these representing corresponding, preferably non-overlapping switch control clock signals.

FIG. 1d shows an example of a clock generator circuit 150 for the circuit of FIG. 1a. The input data signal is DIN. An external clock CKIN generates non-overlapping clocks CK1 and CK2. CK1 is ON in clock phase Phi1, CK2 is ON in clock phase Phi2. CK2 can thus be used to drive the poles of switches 108 and 110 connecting to Cf during Phi2, and CK1 is suitable to drive the pole of switch 110 connecting to $V_{mid2}$ during Phi1. To drive the remaining poles of switch 108 during Phi1 to VP when DIN is high and VN when DIN is low, clocks CK1A and CK1B are generated by the AND gates 152a and 152b. The operation of these clocks is summarised in the expanded version of Table 1a, in Table 1b below, where the clocks in the right-hand column correspond to the connections shown in the centre two columns.

TABLE 1b

| Switch | Connected to: During Phi1 (Charge) | During Phi2 (Dump) | By Clock: |
|---|---|---|---|
| 110 | Vmid2 | | CK1 |
| | | Cf | CK2 |
| 108 | VP/ VN | | CK1A CK1B |
| | | Cf | CK2 |

FIG. 1e shows a timing diagram the circuit of FIG. 1d, in particular CKIN 160, DIN 162 (11001 . . . ), CK1 164, CK2 166, CK1A 168a, & CK1B 168b; note the underlap of clocks CK1, CK2, and CK1A, CK1B alternating according to DIN.

In more detail, during the charging phase Phi1 capacitor C2 is charged, with $V_{mid2}$ (generally the same voltage as $V_{mid}$) applied to one terminal via switch 110 and $V_P$ or $V_N$ applied to the other terminal via switch 108. Typically values of $V_P$ 112 and $V_N$ 114 are +3V and −3V respectively, with respect to $V_{mid}$ 118. The choice of $V_P$ or $V_N$ for any particular cycle is defined by a digital delta-sigma signal applied to switch 108 during this charging phase Phi1. During the dump phase, Phi2, C2 is disconnected from $V_P$, $V_N$ and $V_{mid2}$ and connected in parallel with the op amp feedback capacitor $C_f$ 104 via switches 110 and 108.

Typically C2 106 is much smaller than the op amp feedback capacitor $C_f$ 104. The left-hand side of C2 is switched between a voltage equal to $V_{mid}$ 118 (since the inverting terminal of op amp 102 is a virtual earth, that is it is at substantially the same voltage as the non-inverting terminal) and $V_{mid2}$. Assume for simplicity that as usual $V_{mid2}=V_{mid}$. Then if $V_P$ rather than $V_N$ is applied to the other end of C2 during Phi1 for many consecutive clock cycles, the output $V_{out}$ 120 will converge to equal $V_P$ 112, to achieve a steady state in which both the left-hand side and the right-hand side of C2 106 are switched between equal voltages each cycle. Similarly if $V_N$ 114 is applied each cycle, $V_{out}$ will converge to $V_N$ 114. If $V_P$ and $V_N$ are each applied half the time, the output 120 will be the average of $V_P$ and $V_N$. In general for a $V_P$:$V_N$ duty cycle of m:(1−m), the steady-state output will be given by:

$$V_{out}=m*V_P+(1-m)*V_N \quad \text{(Equation 1)}$$

For example, if m=0.9, $V_{out}=0.9V_P+0.1V_N$. In this context "duty cycle" should be understood as the fraction, proportion or ratio of the number of connections to $V_P$ to the number of connections to $V_N$, for example measured in clock cycles.

In general m will vary with time, corresponding to the varying value of the input audio signal, but the clock frequency is generally much higher than a typical audio frequency, so it is a good approximation to discuss operation in terms of an m value constant over many cycles.

The duty cycle m is controlled by a digital delta-sigma signal to alternately connect C2 106 to $V_P$ and $V_N$ to provide the required output voltage 120. This output voltage 120 will vary from $V_P$ to $V_N$ according to the duty cycle applied. Thus, in effect, the DAC circuit may be considered as having a gain from the voltages (112 and 114) applied to the switched capacitor to the output 102 defined by $(V_{out,max}-V_{out,min})/(V_P-V_N)$ of substantially unity.

The skilled person will recognise that the gain of circuit 100 may be adjusted, for example, by connecting a voltage divider to output 120 and taking the voltage for capacitor $C_f$ 104 from a tap point on this divider, for example to provide a gain of 2. However typically the circuit will have a relatively low gain, for example less than 10 and more typically less than 3. This also applies to the DAC circuits which are described later.

An earlier patent of one of the inventors, U.S. Pat. No. 6,573,850, recognised that the above-described prior art DAC circuit suffers from a problem associated with signal-dependent loading of reference voltage sources for voltages $V_P$ 112 and $V_N$ 114. The way in which this problem arises and the solution provided by U.S. Pat. No. 6,573,850 is discussed further below. Other background prior art (also referenced in U.S. Pat. No. 6,573,850) can be found in U.S. Pat. No. 5,790,064 (a switched capacitor integrator which does not operate on the principle of charge sharing but instead dumps charge into an input of an operational amplifier which in turn drives an integration capacitor), U.S. Pat. No. 5,703,589 and FR 2,666,708 (other switched capacitor integrators), all for analogue-to-digital converter circuits and not intended or suitable for use as high quality digital-to-analogue converters; U.S. Pat. No. 4,896,156, U.S. Pat. No. 4,994,805, EP 0 450 951 (and U.S. Pat. No. 5,148,167), U.S. Pat. No. 6,081,218, U.S. Pat. No. 6,337,647, EP 1 130 784, and "A 120 dB Multi-bit SC Audio DAC with Second Order Noise Shaping", J Rhode, Xue-Mei Gong et al., pages 344–5 in IEEE Solid State Circuit Conference Procs. (ISSCC) 2000.

The manner in which signal-dependent reference source loading arises in the DAC circuit of FIG. 1 can be seen by considering the charge taken from $V_P$ and $V_N$ averaged over many cycles. For the above m:(1−m) duty cycle, and assuming for simplicity that C2<<$C_f$, so that cycle-by-cycle ripple on $V_{out}$ is small, for $V_P$ this is given by:

$m*(V_P-V_{out})*C2$
$=m*(V_P-(m*V_P+(1-m)*V_N))*C2$
$=m*(1-m)*(V_P-V_N)*C2$

This has a parabolic dependence on m, with zeros at m=0 and m=1, and a maximum of $0.25*(V_P-V_N)*C2$ at m=0.5. Loading of $V_N$ shows a similar dependence.

FIG. 2 shows a digital-to-analogue converter 200 with a differential voltage output 120a, b, based upon the circuit of FIG. 1. As can be seen from inspection of FIG. 2, the differential DAC 200 comprises two similar but mirrored circuits 100a, 100b, each corresponding to DAC 100. The positive differential signal processing circuit portion 100a generates a positive output $V_{out}$+ 120a and the negative differential signal processing portion 100b generates a negative voltage output $V_{out}^-$ 120b. Likewise the positive circuit portion 100a is coupled to first reference voltage supplies $V_P^+$ 112a and $V_N^+$ 114a and the negative circuit portion 100b is coupled to second reference voltage supplies $V_P^-$ 112b and $V_N^-$ 114b.

Preferably $V_P^+$ 112a and $V_P^-$ 112b are supplied from a common positive reference voltage source and $V_N^+$ 114a and $V_N^-$ 114b are supplied from a common negative reference voltage source. Thus preferably $V_P^+$ and $V_P^-$ are at the same voltage and $V_N^+$ and $V_N^-$ are at the same voltage. As can be seen C2+ 106a is switched to references $V_P^+$ 112a and $V_N^+$ 114a and C2− 106b is switched to references $V_P^-$ 112b and $V_N^-$ 114b. Voltages $V_{mid2}^+$ 116a and $V_{mid2}^-$ 116b preferably have the same value, preferably the value of $V_{mid}$ 118, typically ground. Preferably feedback capacitors 104a, b and switched capacitors 106a, b have the same value and op amps 102a and 102b are matched. Op amps 102a, b may comprise a single differential-input, differential-output op amp. These same comments also apply to the later described differential DAC circuits.

A clocking scheme for the DAC of FIG. 2 is shown in Table 2 below:

TABLE 2

Switch positions versus clock phase for the differential circuit of FIG. 2

| Switch | Connected to: During Phi1 (Charge) | During Phi2 (Dump) |
|---|---|---|
| 110a | Vmid2+ | Cf+ |
| 110b | Vmid2− | Cf− |

TABLE 2-continued

Switch positions versus clock phase for the differential circuit of FIG. 2

| Switch | Connected to: During Phi1 (Charge) | During Phi2 (Dump) |
|---|---|---|
| 108a | VP+/VN+ | Cf+ |
| 108b | VN−/VP− | Cf− |

Continuing to refer to FIG. 2, in operation, whenever $V_P^+$ is chosen to charge $C2^+$, then $V_N^-$ is selected to charge $C2^-$. Thus by symmetry, from equation (1) above, one can write $$V_{out}^- = m*V_N^- + (1-m)*V_P^- \quad \text{(Equation 2)}$$

When, for example, m=0.9, $V_{out}^- = 0.9\ V_N^- + 0.1\ V_P^-$; when m=0.5, $V_{out}^+ = V_{out}^- = (V_P + V_N)/2$. As m varies $V_{out}^+$ and $V_{out}^-$ will swing in equal amplitude but opposite polarities about this common-mode (m=0.5) voltage.

The average charge taken from $V_P^+$ will be as above:
$m*(V_P^+ - V_{out}^+)*C2^+$
$= m*(V_P + -(m*V_P^+(1-m)*V_N))*C2$
$= m*(1-m)*(V_P^+ - V_N^+)*C2^+$ The average charge taken from $V_P^-$ will be:
$(1-m)*(V_P^- - V_{out}^-)*C2^-$
$= (1-m)*(V_P^- - m*V_N^- - (1-m)*V_P^-)*C2^-$
$= (1-M)*m(V_P^- - V_N^-)*C2^-$ Thus the average total charge taken from $V_P$ (that is $V_P^+$ and $V_P^-$) is $2*m*(1-m)*(V_P-V_N)*C2$ (where $V_P^+ = V_P^- = V_P$ and $C2^+ = C2^- = C2$). This is just double the charge of the single-sided implementation, as might be surmised by the symmetries of the circuit. Again the function is parabolic, with a minimum of zero (for m=0 or 1) and a maximum of $0.5*(V_P-V_N)*C2$.

To take an example, consider a case where $V_P = +3V$, $V_N = -3V$, and C2=10 pF. Assuming the circuit is clocked at 10 MHz, this will give rise to a current varying from zero to $0.5*(+3V-(-3V))*10$ pF*01 MHz=300 μA drawn from $V_P$ and $V_N$ depending on the low-frequency level of the output signal $V_{out}$. If the equivalent source impedance of the sources of $V_P$ and $V_N$ are 1 ohm each, this will give a modulation of $(V_P-V_N)$ of 0.6 m Vpk-pk., that is 0.1% of $(V_P-V_N)$. This will modulate the output signal by a similar amount (as with a multiplying DAC) and is a gross effect in a system aimed at typically −100 dB (0.001%) THD.

FIG. 3 shows a multibit differential switched capacitor DAC 300, a common extension to the circuit of FIG. 2. In this extension multiple independently switched capacitors are used in place of the capacitor $C2^+$ (and $C2^-$). Although FIG. 3 shows just two additional capacitors for each circuit 106*aa,bb* (for simplicity) and four corresponding additional switches 108*aa,bb*, 110*aa,bb*, in practice a plurality of additional capacitors and switches may be provided for each differential signal processing circuit portion. A clocking scheme for this circuit is given in Table 3 below.

TABLE 3

Switch positions versus clock phase for the multi-bit differential circuit of FIG. 3

| Switch | Connected to: During Phi1 (Charge) | During Phi2 (Dump) |
|---|---|---|
| 110a | Vmid2+ | Cf+ |
| 110b | Vmid2− | Cf− |
| 108a | VP+/VN+ | Cf+ |
| 108b | VN−/VP− | Cf− |
| 110aa | Vmid2+ | Cf+ |
| 110ba | Vmid2− | Cf− |
| 108aa | VP+/VN+ | Cf+ |
| 108ba | VN−/VP− | Cf− |
| . . . | | |

In effect, the switched capacitors C2 of FIG. 3 may be replaced by an array of capacitors. The capacitors in such arrays may or may not be binary weighted. In one arrangement the LSB capacitors are binary weighted, but the MSB capacitors are equally weighted, and used in a random manner to decrease the effects of mismatch. Suitable methods for deriving the necessary multi-bit delta-sigma digital control waveforms, to define the cycle-by-cycle connections to $V_P$ or $V_N$ of each capacitor in these arrays, are well known to those skilled in the art and described, for example, in "Delta-sigma data converters—theory design and simulation" edited by Steven R Norsworthy, Richard Schreier, Gabor C Temes, IEEE Press, New York 1997, ISBN 0-7803-1045-4, hereby incorporated by reference. Analysis of this circuit gives a similar variation in reference loading with signal.

There is therefore a need for charge-sharing, switched capacitor DAC circuits which exhibit reduced signal-dependent loading of reference sources.

The circuit of U.S. Pat. No. 6,573,850 achieves this by briefly connecting the switched capacitor to a substantially signal-independent reference voltage prior to connection of this capacitor to one of the reference voltages. Connecting the switched capacitor to a substantially signal-independent reference before connecting it to one of the references allows signal-dependent charges to flow onto or off the switched capacitor before the capacitor is recharged. In other words the charge on the switched capacitor may be brought to a substantially signal-independent or predetermined state of charge prior to its connection to one of the references, so that there is little or no signal-dependent loading of these references. However the circuits of U.S. Pat. No. 6,573,850 require an additional clock phase to be generated and distributed, and generally also require the generation of a suitable signal-independent reference voltage.

Two further issues arise with high performance switched-capacitor audio DACs, firstly problems of flicker noise (sometimes called 1/f noise) in the MOS devices typically used to implement the op amps, and secondly problems with crosstalk between amplifiers due to combinations of common supply impedances, poor audio-frequency supply decoupling, and finite op amp power-supply rejection.

Flicker noise power is approximately inversely proportional to the area of the devices used, so to gain 6 dB in reduced flicker noise requires input devices of four times the area. For SNR of 100 dB or greater (120 dB is becoming a target for high-performance systems), it rapidly becomes impractical to achieve a flicker noise corner frequency below say 1 kHz, and even then with a significant impact on chip area and hence cost.

The load regulation bandwidth of active power supplies is often inadequate to prevent millivolts of ripple at higher audio frequencies, especially as these supplies may also be supplying high-power outputs to drive speakers or headphones. Often several channels of DAC (e.g. six) are implemented on the same silicon chip but without the expense of extra supply pins it is difficult to distribute the supplies to all amplifiers (including power output stages) without several ohms of common supply impedance. The resulting modulation of the local supply voltage of each channel in conjunction with the finite supply rejection of the op amps, itself diminishing with high audio frequency, can be a significant source of crosstalk between channels relative to a typical target of 100 dB.

Both the op amp flicker noise and op amp supply rejection (or rather lack of it) can be modelled as a modulation of the input offset voltage of the op amps in question. One known technique for mitigating these effects is the "chopper" technique. FIG. 4 shows this applied to a simple DAC circuit 400. Table 4, below, shows a clocking scheme for the DAC of FIG. 4.

TABLE 4

Switch positions versus clock phase for the chopped differential DAC circuit of FIG. 4

| Switch | Connected to: During Phi1 (Charge) | During Phi2 (Dump) | During Phi3 (Charge) | During Phi4 (Dump) |
|---|---|---|---|---|
| 110a | Vmid2+ | Cf+ | Vmid2+ | Cf+ |
| 110b | Vmid2− | Cf− | Vmid2− | Cf− |
| 108a | VP+/VN+ | Cf+ | VP+/VN+ | Cf+ |
| 108b | VN−/VP− | Cf− | VN−/VP− | Cf− |
| 401a | Cf+ | Cf+ | Cf− | Cf− |
| 401b | Cf− | Cf− | Cf+ | Cf+ |
| 402a | Cf+ | Cf+ | Cf− | Cf− |
| 402b | Cf− | Cf− | Cf+ | Cf+ |

In the differential circuit of FIG. 4 the difference in offsets between the two op amps is modelled as an effective offset $V_{off}$ to the first op amp 102a. In one clock cycle, op amp 102a is connected to one feedback capacitor, and its effective offset $V_{off}$ affects the output of the respective output, $V_{out}^+$ by $V_{off}$. In the next clock cycle, op amp 102a is connected to the other symmetric half of the capacitor network, and has the same effect on the negative output $V_{out}^-$. The low-frequency offset of the op amp thus appears on the outputs as a common-mode average signal of $V_{off}/2$, together with a differential output as a modulation of $+/-V_{off}/2$ at $f_s/2$ where $f_s$ is the sample rate of the input signal (ie. the charge-dump cycle frequency), but there is no corresponding low-frequency differential signal. In embodiments the high frequency components are filtered out by a subsequent post-filter preferably employed in any case to attenuate the ultrasonic high-frequency delta-sigma quantisation noise components.

The differential DAC circuits of U.S. Pat. No. 6,573,850 are intended to provide a substantially constant load on a clock cycle-by-cycle basis, for example to give a constant charge load on $V_P$ each clock cycle. We will now describe alternative schemes, based on a different but related principle, providing a substantially constant charge load only when averaged over multiple clock cycles. This is nonetheless useful, since the clock frequency is normally much greater than the signal frequency and thus any artefacts at half the clock frequency can be easily post-filtered. In any case some post-filtering is generally required because of spikes of current on $V_P$ and $V_N$ at the clock frequency.

SUMMARY OF THE INVENTION

According to a first aspect of the present invention there is therefore provided a differential switched capacitor digital-to-analogue (DAC) circuit comprising first and second differential signal circuit portions for providing respective positive and negative signal outputs with respect to a reference level, and having at least one first reference voltage input and at least one second reference voltage input for receiving respective positive and negative references with respect to said reference level; each of said first and second circuit portions comprising an amplifier with a feedback capacitor, a second capacitor, and a switch to switchably couple said second capacitor to a selected one of said reference voltage inputs to charge the second capacitor and to said feedback capacitor to share charge with the feedback capacitor, and wherein said switch of said first circuit portion is further configured to connect said second capacitor of said first circuit portion to share charge with said feedback capacitor of said second circuit portion, and wherein said switch of said second circuit portion is further configured to connect said second capacitor of said second circuit portion to share charge with said feedback capacitor of said first circuit portion.

The facility to connect the second capacitor of each (say the positive) circuit portion to share charge with the feedback capacitor of either circuit portion enables the second capacitor to in effect be alternately pre-charged to positive and negative (signal dependent) nodes so that, on average, signal dependent loading of a reference source supplying positive and negative (voltage) references to which the second capacitor is connected for charging is mitigated. More particularly, in embodiments each second capacitor is connected alternately to positive and negative signal-dependent nodes of the circuit (in effect to share charge with the feedback capacitors of the positive and negative circuit portions). Still more particularly each second capacitor is connected alternately to positive and negative feedback capacitor (signal) nodes firstly when being charged to the positive reference voltage, and secondly when being charged to the negative reference voltage. Charging each second capacitor to both the positive reference voltage (for two charge-dump cycles) and to the negative reference voltage (for two charge-dump cycles) enables the capacitor to be charged (positively, and negatively) in such a way that the charge can be dumped to positive and negative signal nodes (feedback capacitors), thus facilitating the above-mentioned positive/negative pre-charge. In embodiments this results in an eight phase charge-dump clocking scheme, comprising four successive charge-dump cycles, the second (switched) capacitors being connected to a positive signal node for a first pair of charge-dump cycles and to a negative signal node for a second pair of charge-dump cycles.

According to a related aspect of the present invention there is therefore further provided a differential switched capacitor circuit comprising positive and negative circuit portions to provide respective positive and negative differential signal outputs based upon positive and negative references, each of said positive and negative circuit portions comprising an operational amplifier with a feedback capacitor and at least one switched capacitor connectable to one of said positive and negative references to store charge and to one of a positive and negative signal node to substantially dump said stored charge to a said feedback capacitor, and wherein said switched capacitors of said positive and negative circuit portions are switched according to an eight phase clocking scheme comprising four successive charge-dump cycles and in which said switched capacitors are connected to a said positive signal node for a first pair of said charge-dump cycles and to a said negative signal node for a second pair of said charge-dump cycles.

Preferred embodiments of the above described aspects of the invention also chop or exchange the amplifiers for the first and second (positive and negative) circuit portions in alternate charge-dump cycles, preferably alternating every second charge-dump cycle.

In embodiments this provides additional benefits, of firstly desensitising the output signal to flicker noise of the amplifiers employed, allowing smaller devices to be used therein, with a consequent chip area saving; and secondly improving the rejection of audio frequency supply ripple, giving potentially less crosstalk between DACs, especially when sharing supplies on one chip, or allowing relaxation of the requirements for audio frequency supply decoupling for a given performance, with potential external component cost savings.

Preferred embodiments of the above described aspects of the invention further include a switch controller or clock generator to control switching of the second (switched) capacitors and, where implemented, of the amplifiers of the first and second circuit portions, in particular responsive to a digital input to the DAC.

In embodiments the above described DACs may be implemented as multi-bit DACs by using a plurality or array of capacitors in place of each of the above mentioned second (switched) capacitors, providing corresponding switching to allow each capacitor of the array to be connected to a selected one of the feedback capacitors of the first and second (or positive and negative) circuit portions.

In a further aspect the invention provides a method of operating a differential digital-to-analogue (DAC) circuit to reduce signal dependent loading of a reference source associated with the DAC circuit, the DAC circuit comprising positive and negative signal processing devices each with a feedback capacitor coupled to a respective positive and negative signal node and each having a second capacitor switchably couplable to said reference source for charging and to a said signal node for dumping charge to a said feedback capacitor, the method comprising repeatedly: coupling said second capacitors to said reference source for charging; and coupling said second capacitors to alternate ones of said positive and negative signal nodes for dumping stored charge to a said feedback capacitor; such that on average over a plurality of charge-dump cycles charge loading of said reference source by said DAC circuit is substantially constant.

Preferably each of the second capacitors is coupled to one of said positive and negative signal nodes for two cycles and then to the other of said positive and negative signal nodes for two cycles, for each of these two cycles the capacitor being charged from the same (positive or negative) reference voltage level (which preferably also alternates every two charge-dump cycles).

BRIEF DESCRIPTION OF THE DRAWINGS

These and other aspects of the invention will now be further described, by way of example only, with reference to the accompanying figures in which:

FIGS. 1a to 1e show, respectively a switched capacitor digital-to-analogue converter (DAC) according to the prior art, a clocking scheme for the DAC of FIG. 1, and a tabular representation of the clocking scheme, a clock generator circuit for the clocking scheme, and a timing diagram for the clock generator circuit;

DETAILED DESCRIPTION OF THE PREFERRED EMBODIMENTS

Figure 1D:
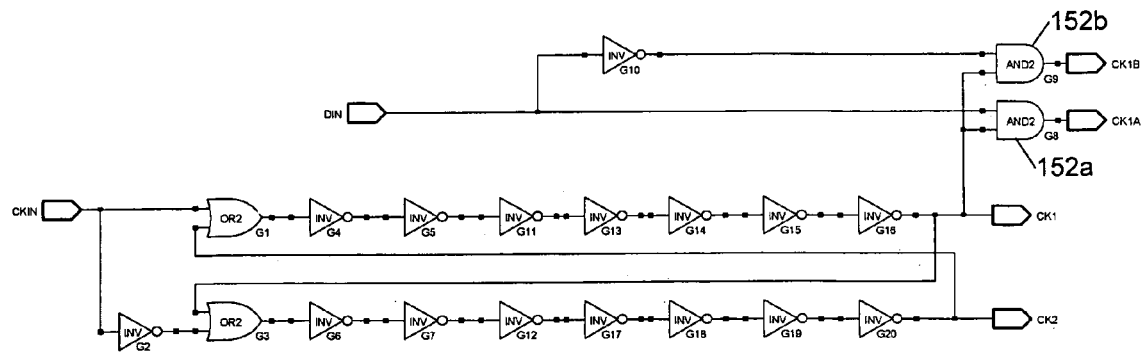
Figure 1E:
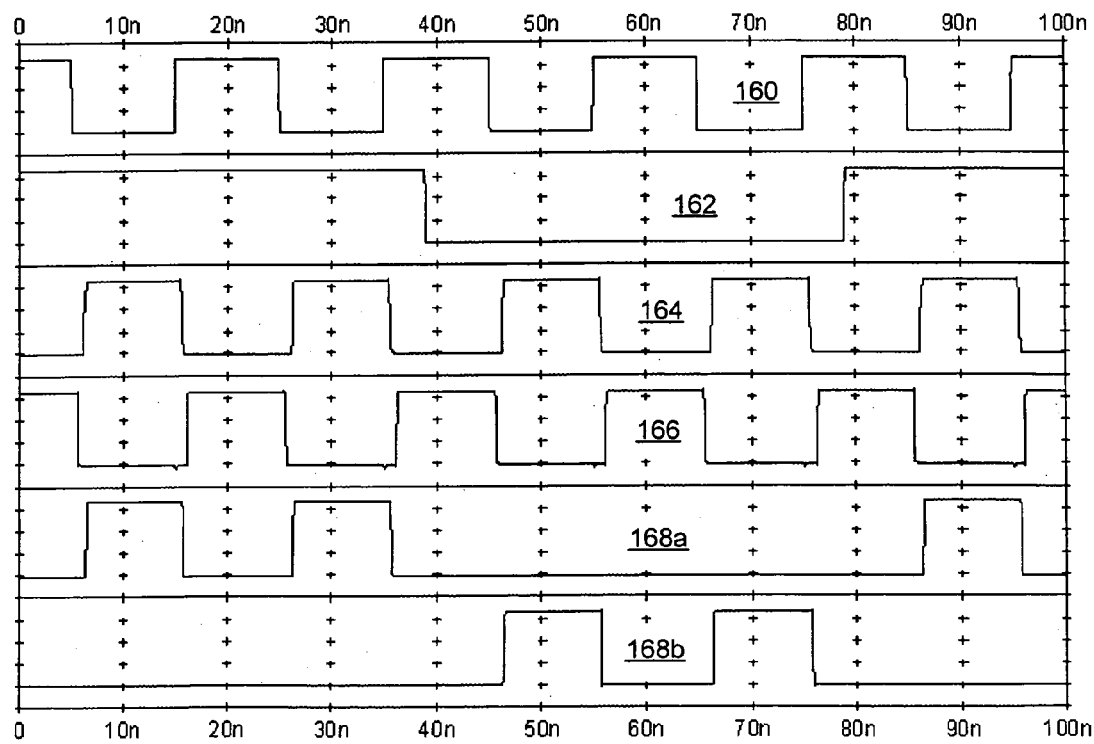
Figure 2:
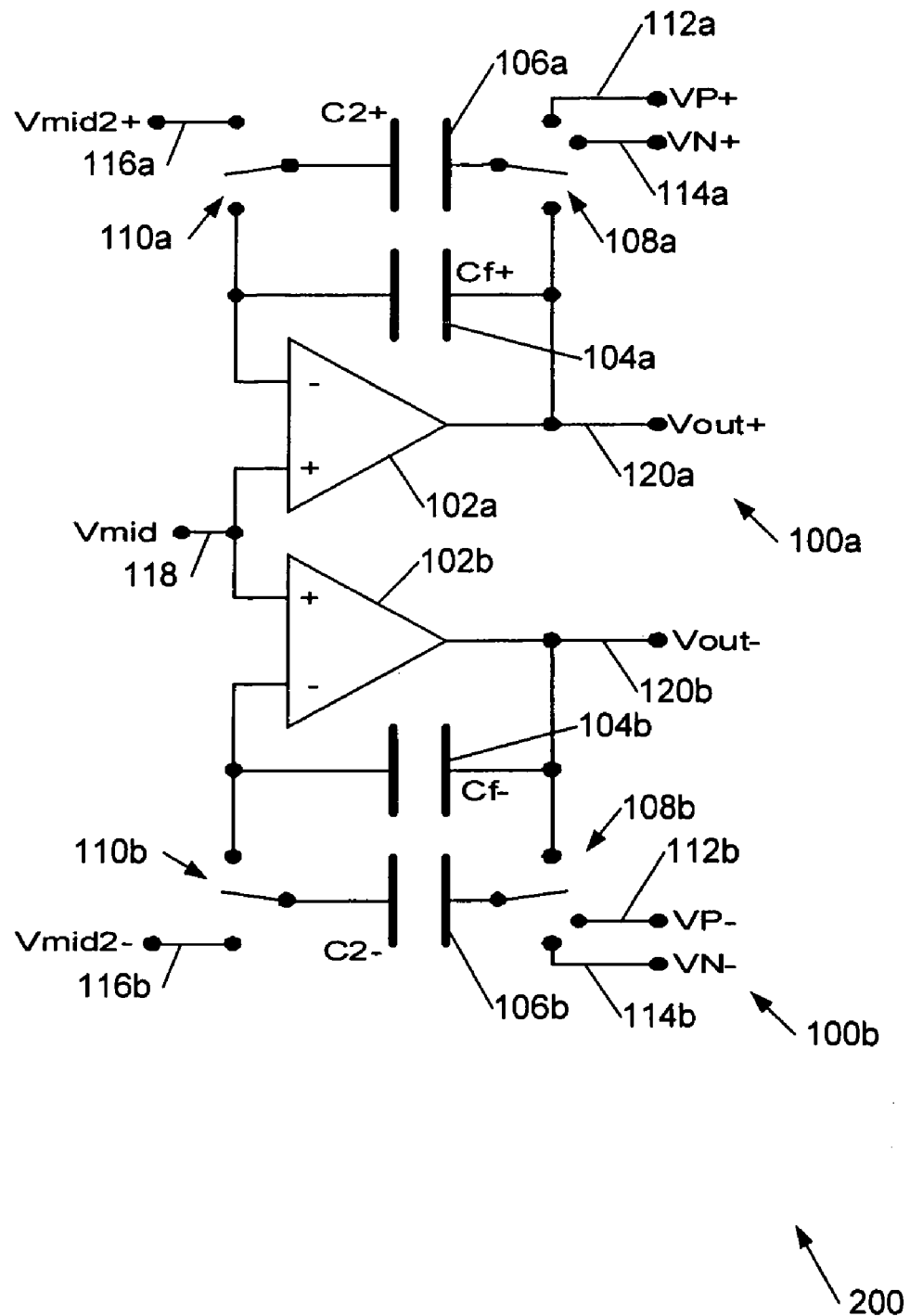
FIG. 2 shows a differential switched capacitor DAC according to the prior art.
Figure 5A:
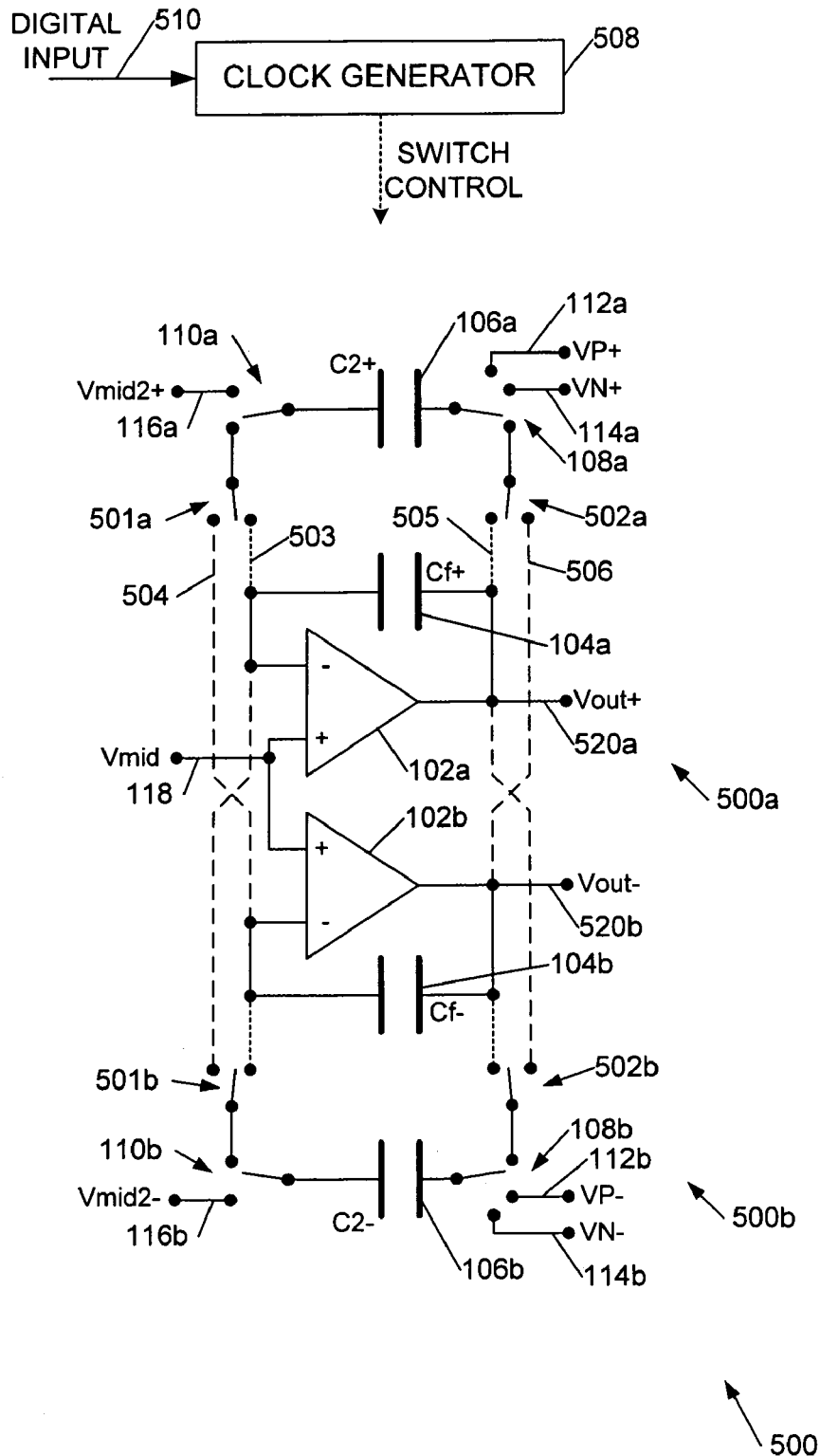
FIGS. 5a to 5c show, respectively, a digital-to-analogue converter (DAC) with chopper connections to the switched capacitors to reduce signal-dependent reference source loading, on eight phase clock generator for the DAC of FIG. 5a, and a timing diagram for the clock generator, according to an embodiment of the present invention.

Referring to FIG. 5a, this shows a differential DAC circuit 500 including chopper switches 501a,b, 502a,b to reduce the signal-dependent reference loading. The DAC circuit of FIG. 5 is a development of that shown in FIG. 2 (like elements are indicated by like reference numerals) and comprises a pair of DAC circuits 500a,b to provide a differential output 520a, b.

Capacitor 106a is still charged to $V_P$ or $V_N$ via switches 110a, 108a. However, rather than discharging directly via switches 110a, 108a onto capacitor 104a, it discharges onto either capacitor 104a or 104b, via additional connections 503, 505, and 504, 506, according to the polarity of additional series switches 501a, 502a. There is a similar arrangement for capacitor 106b. The switches 501a, 501b, 502a, 502b may be switched to alternate every cycle giving a 4-phase clocking scheme as shown in Table 5a (below) or every second cycle giving an 8-phase clocking scheme as shown in Table 5c. Other possible clocking schemes are discussed later. By alternately discharging to either capacitor 106a or 106b, i.e. to nodes whose signal voltages are equal and opposite, the aim is to cancel the signal-dependent terms in time-average charge taken from references $V_P$ and $V_N$.

Table 5a, below, shows a 4-phase clocking scheme for the DAC 500 of FIG. 5a.

TABLE 5a

Switch positions versus clock phase for a 4-phase clocking scheme for the DAC circuit of FIG. 5

| Switch | Connected to: During Phi1 (Charge) | During Phi2 (Dump) | During Phi3 (Charge) | During Phi4 (Dump) |
|---|---|---|---|---|
| 110a | Vmid2+ | 501a | Vmid2+ | 501a |
| 110b | Vmid2− | 501b | Vmid2− | 501b |
| 108a | VP+/VN+ | 502a | VN+/VP+ | 502a |
| 108b | VN−/VP− | 502b | VP−/VN− | 502b |
| 501a | Cf+ | Cf+ | Cf− | Cf− |
| 501b | Cf− | Cf− | Cf+ | Cf+ |
| 502a | Cf+ | Cf+ | Cf− | Cf− |
| 502b | Cf− | Cf− | Cf+ | Cf+ |

This clocking scheme is implemented by a clock generator 508, in response to a digital signal input 510, the clock generator also performing delta-sigma digital signal preprocessing in a conventional manner. In later described DAC circuits the clock generator will not be shown in the figures, for simplicity. The switches of this and the later described DAC circuits may comprise FET (or MOSFET) switches controlled by clock generator 508. Additional low pass filtering (not shown in the Figure) may be provided on outputs 520*a,b*, starting to roll off, for example just above the audio band (say 0.1 dB at 20 kHz) to maximise attenuation of ultrasonic delta-sigma quantisation noise, and so providing substantial (say>40 dB) attenuation by fs/4, (typically 3 MHz).

We next analyse the clocking scheme of Table 5a (it is helpful to read this in conjunction with Table 5b below). As before assume $C_f^+$ 104*a* is to receive positive increments of charge from $V_P$ for a fraction m of the clock cycles, and negative increments of charge from $V_N$ for the remaining fraction (1−m). Then $C_f^-$ 104*b* is to receive positive increments of charge from VP for a fraction (1−m) of the clock cycles, and negative increments of charge from $V_N$ for the remaining fraction m, giving $V_{out}^+ = m^*V_P^+(1-m)^*V_N$, $V_{OUt}^- = (1-m)^*V_P^+m^*V_N$.

In those (charge) cycles where C2$^+$ has just previously been disconnected from $C_f^-$ (and hence $V_{out}^-$), i.e. Phi1, it will be connected to $C_f^+$ on the next (dump) phase Phi2, so for a fraction (m) of the cycles it will be charged to $V_P$, taking a charge of $C2^{+*}(V_P-V_{out}^-)$ and for a fraction (1−m) of the cycles it will be charged to $V_N$, taking a charge of $C2^{+*}(V_N-V_{out}^-)$. In those (charge) cycles where C2$^+$ has just been disconnected from $C_f^+$ (and hence $V_{out}^+$), i.e. Phi3, it will be connected to $C_f^-$ on the next (dump) phase Phi4, so for a fraction (1−m) of the cycles it will be charged to $V_P$, taking a charge of $C2^{+*}(V_P-V_{out}^-)$, and for a fraction (m) of the cycles it will be charged to $V_N$, taking a charge of $C2^{+*}(V_N-V_{out})$.

Thus the (average) charge taken from $V_P$ by C2$^+$ over each four clock phases will be:

$$C2^{+*}(V_P-V_{out}^+)^*(1-m)+C2^{+*}(V_P-V_{out}^-)^*m$$

Since C2$^+$ and C2$^-$ are indistinguishable in this circuit, C2$^-$ will take an equal charge, so the total charge taken from $V_P$ will be:

$$2^*C2^*(V_P-V_{out}^{+*}(1-m)-V_{out}^-*m).$$

Noting that $V_{out}^+ = m^*V_P + (1-m)^*V_N$, $V_{out}^- = (1-m)^*V_P + m^*V_N$, the total charge from $V_P$ can be written as:

$2^*C2^*(V_P-(1-m)^*(m.V_P+(1-m).V_N)-m^*((1-m).V_P+m^*V_N)$
$=2^*C2^*(V_P(1-m+m^2-m+m^2)-V_N(1-2m+m^2+m^2))$
$=2^*C2^*(V_P-V_N)(1-2m+2m^2)$

However this is still not signal independent as desired (having a maximum at m=0.5), essentially because of the correlation of $V_{out}^+$ and $V_{out}^-$ with m.

Table 5b below summarises the charging and dumping of one of the switched capacitors (C2$^+$) and the above analysis.

TABLE 5b

| | Clock | | | | |
|---|---|---|---|---|---|
| Charge | Φ 1 | C2$^+$ (for fraction m) | to $V_P$ | [C2$^+$ was at $V_{out}^-$] | cycle 1 |
| Dump | Φ 2 | C2$^+$ | to $C_f^+$ | [C2$^+$ to $V_{out}^+$] | |
| Charge | Φ 3 | C2$^+$ (for fraction m) | to $V_N$ | [C2$^+$ was at $V_{out}^+$] | cycle 2 |
| Dump | Φ 4 | C2$^+$ | to $C_f^-$ | [C2$^+$ to $V_{out}^-$] | |
| During | Φ 1 | C2$^+$ takes | m C2$^+$ (V$_P$ − V$_{out}^-$) | | from V$_P$ |
| During | Φ 3 | C2$^+$ takes | (1 − m) C2$^+$ (V$_P$ − V$_{out}^+$) | | from V$_P$ |
| Total (average) charge over several cycles | for C2$^+$ | | C2 (V$_P$ − V$_N$)(1 − 2m + 2m$^2$) | | |
| | for C2$^-$ (same as C2$^+$) | | C2 (V$_P$ − V$_N$)(1 − 2m + 2m$^2$) | | |
| Total | | | 2(C2(V$_P$ − V$_N$)(1 − 2m + 2m$^2$)) | | |

The situation can be improved by using an alternate, 8-phase clocking scheme for the DAC 500 of FIG. 5*a*, as shown in Table 5c below, where the new switches are clocked at half the clock rate.

TABLE 5c

Switch positions versus clock phase for an 8-phase clocking scheme for the DAC circuit of FIG. 5

| | Connected to: | | | | | | | |
|---|---|---|---|---|---|---|---|---|
| Switch | Phi1 (Charge) | Phi2 (Dump) | Phi3 (Charge) | Phi4 (Dump) | Phi5 (Charge) | Phi6 (Dump) | Phi7 (Charge) | Phi8 (Dump) |
| 110a | Vmid2+ | 501a | Vmid2+ | 501a | Vmid2+ | 501a | Vmid2+ | 501a |
| 110b | Vmid2− | 501b | Vmid2− | 501b | Vmid2− | 501b | Vmid2− | 501b |
| 108a | VP+/VN+ | 502a | VP+/VN+ | 502a | VN+/VP+ | 502a | VN+/VP+ | 502a |
| 108b | VN−/VP− | 502b | VN−/VP− | 502b | VP−/VN− | 502b | VP−/VN− | 502b |
| 501a | Cf+ | Cf+ | Cf+ | Cf+ | Cf− | Cf− | Cf− | Cf− |
| 501b | Cf− | Cf− | Cf− | Cf− | Cf+ | Cf+ | Cf+ | Cf+ |
| 502a | Cf+ | Cf+ | Cf+ | Cf+ | Cf− | Cf− | Cf− | Cf− |
| 502b | Cf− | Cf− | Cf− | Cf− | Cf+ | Cf+ | Cf+ | Cf+ |

To analyse this scheme again consider operation with a "duty cycle" of m (it is helpful to read this in conjunction with Table 5d below). We start with Phi1 where C2$^+$ has just been disconnected from $V_{out}^-$ and anticipates a connection with $V_{out}^+$ in the second half of the cycle, dump phase Phi2. The probability of being charged to $V_P$ from $V_{out}^-$ is m, giving an expected average charge taken from $V_P$ of $m.C2^+(V_P-V_{out}^-)$. The next Phi3, there is still a probability m of being charged to $V_P$, giving an expected charge taken from $V_P$ of $m.C2^+(V_P-V_{out}^+)$. Thus the (average) charge taken from $V_P$ by $C2^+$ over these two clock cycles is $2m.C2^+(V_P-(V_{out}^++V_{out}^-)/2)$. Similarly, the charge taken by $C2^-$ over these two clock periods is $2(1-m)C2^+(V_P-(V_{out}^{-+V}{}_{out}^+)/2)$. So the total charge over these two clock periods (which is the same for the next two clock periods) taken by the combination of $C2^+$ and $C2^-$ is $2.C2(V_P-(V_{out}^+ +V_{out}^-)/2)$. Since the signals on $V_{out}^+$ and $V_{out}^-$ are in antiphase, this is independent of the signal (and can be simplified to $C2(V_P-V_N)$ relying on $(V_{out}^++V_{out}^-)/2=(V_P+V_N)/2)$.

Table 5d below summarises the 8-phase charging and dumping clocking scheme for one of the switched capacitors ($C2^+$) and the results of the above analysis.

Table 5e, where the clocks in the right-hand column correspond to the connections shown in the centre eight columns. As before, the input data signal is DIN. An external clock CKIN generates non-overlapping clocks CK1 and CK2. CK1 is ON in odd phases, CK2 is ON in even clock phases. CK2 can thus be used to drive the poles of switches 110a, 110b, 108a, 108b, connecting to 501a, 501b, 502a, 502b respectively during even phases, and CK1 is suitable to drive the poles of switches 110a, 110b connecting to Vmid2+, Vmid2− respectively during odd phases.

Clock CHCK is derived by dividing CKIN by 4 using the two D-types. From CHCK are generated non-overlapping clocks CHCK1 and CHCK2, respectively driving switches 501a, 501b, 502a, 502b to Cf+ or Cf− in alternate sets of four clock phases.

To drive the remaining poles of switch, clocks CK1A and CK1B are generated by the AND gates 552a and 552b, but TABLE 5d

| | Clock | | | | |
|---|---|---|---|---|---|
| Charge | Φ1 | (for fraction m) | to $V_P$ | [$C2^+$ was at $V_{out}^-$] | cycle 1 |
| Dump | Φ2 | | to $C_f^+$ | [C2 to $V_{out}^+$] | ($V_P C_f^+$) |
| Charge | Φ3 | (for fraction m) | to $V_P$ | [C2 was at $V_{out}^+$] | cycle 2 |
| Dump | Φ4 | | to $C_f^+$ | [C2 to $V_{out}^+$] | ($V_P C_f^+$) |
| Charge | Φ5 | (for fraction m) | to $V_N$ | [C2 was at $V_{out}^+$] | cycle 3 |
| Dump | Φ6 | | to $C_f^-$ | [C2 to $V_{out}^-$] | ($V_N C_f^-$) |
| Charge | Φ7 | (for fraction m) | to $V_N$ | [$C2^+$ was at $V_{out}^-$] | cycle 4 |
| Dump | Φ8 | | to $C_f^-$ | [C2 to $V_{out}^-$] | ($V_N C_f^-$) |

Charge taken from $V_P$ during charging phases:

| | By $C2^+$ | By $C2^-$: |
|---|---|---|
| Φ1 | $mC2^+(V_P - V_{out}^-)$ | |
| Φ3 | $mC2^+(V_P - V_{out}^+)$ | |
| Sum: | $2mC2^+(V_P - 1/2(V_{out}^+ + V_{out}^-))$ | $2(1-m)C2^-(V_P - 1/2(V_{out}^+ + V_{out}^-))$ |
| Total: | $C2(V_P - V_N)$ | |
| Φ5 | $(1-m)C2^+(V_P - V_{out}^+)$ | |
| Φ7 | $(1-m)C2^+(V_P - V_{out}^-)$ | |
| Sum: | $2(1-m)C2^+(V_P - 1/2(V_{out}^+ + V_{out}^-))$ | $2mC2^-(V_P - 1/2(V_{out}^+ + V_{out}^-))$ |
| Total: | $C2(V_P - V_N)$ | |

Figure 5B:
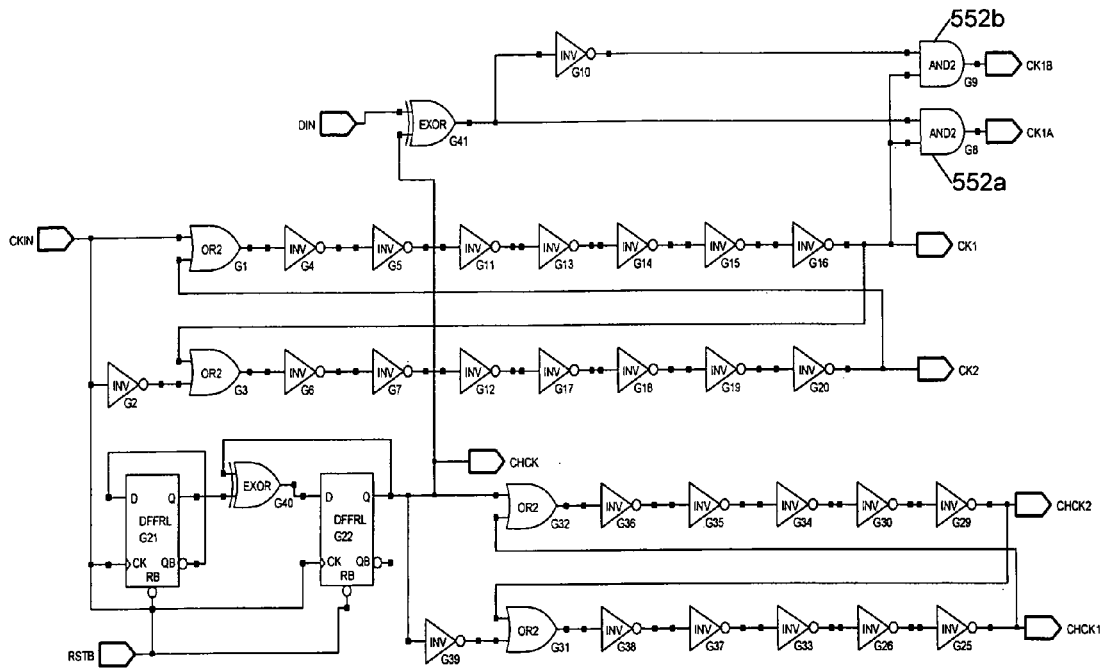

FIG. 5b shows an example of a clock generator circuit 550 for the DAC circuit 500 of FIG. 5a. The operation of these clocks is summarised in the expanded version of Table 5d in instead of the gates being driven directly from DIN, DIN is inverted in phases Phi5 to Phi8, to allow for the effective periodic inversion of gain by the chopper action.

TABLE 5e

| | Connected to: | | | | | | | | |
|---|---|---|---|---|---|---|---|---|---|
| Switch | Phi1 (Charge) | Phi2 (Dump) | Phi3 (Charge) | Phi4 (Dump) | Phi5 (Charge) | Phi6 (Dump) | Phi7 (Charge) | Phi8 (Dump) | By Clock: |
| 110a | Vmid2+ | | Vmid2+ | | Vmid2+ | | Vmid2+ | | CK1 |
| | | 501a | | 501a | | 501a | | 501a | CK2 |
| 110b | Vmid2− | | Vmid2− | | Vmid2− | | Vmid2− | | CK1 |
| | | 501b | | 501b | | 501b | | 501b | CK2 |
| 108a | VP+/ VN+ | | VP+/ VN+ | | VP+/ VN+ | | VP+/ VN+ | | CK1A CK1B |
| | | 502a | | 502a | | 502a | | 502a | CK2 |
| 108b | VN−/ VP− | | VN−/ VP− | | VN−/ VP− | | VN−/ VP− | | CK1A CK1B |
| | | 502b | | 502b | | 502b | | 502b | CK2 |

TABLE 5e-continued

| Switch | Connected to: Phi1 (Charge) | Phi2 (Dump) | Phi3 (Charge) | Phi4 (Dump) | Phi5 (Charge) | Phi6 (Dump) | Phi7 (Charge) | Phi8 (Dump) | By Clock: |
|---|---|---|---|---|---|---|---|---|---|
| 501a | Cf+ | Cf+ | Cf+ | Cf+ | | | | | CHCK1 |
|  |  |  |  |  | Cf− | Cf− | Cf− | Cf− | CHCK2 |
| 501b | Cf− | Cf− | Cf− | Cf− | | | | | CHCK1 |
|  |  |  |  |  | Cf+ | Cf+ | Cf+ | Cf+ | CHCK2 |
| 502a | Cf+ | Cf+ | Cf+ | Cf+ | | | | | CHCK1 |
|  |  |  |  |  | Cf− | Cf− | Cf− | Cf− | CHCK2 |
| 502b | Cf− | Cf− | Cf− | Cf− | | | | | CHCK1 |
|  |  |  |  |  | Cf+ | Cf+ | Cf+ | Cf+ | CHCK2 |

Figure 5C:
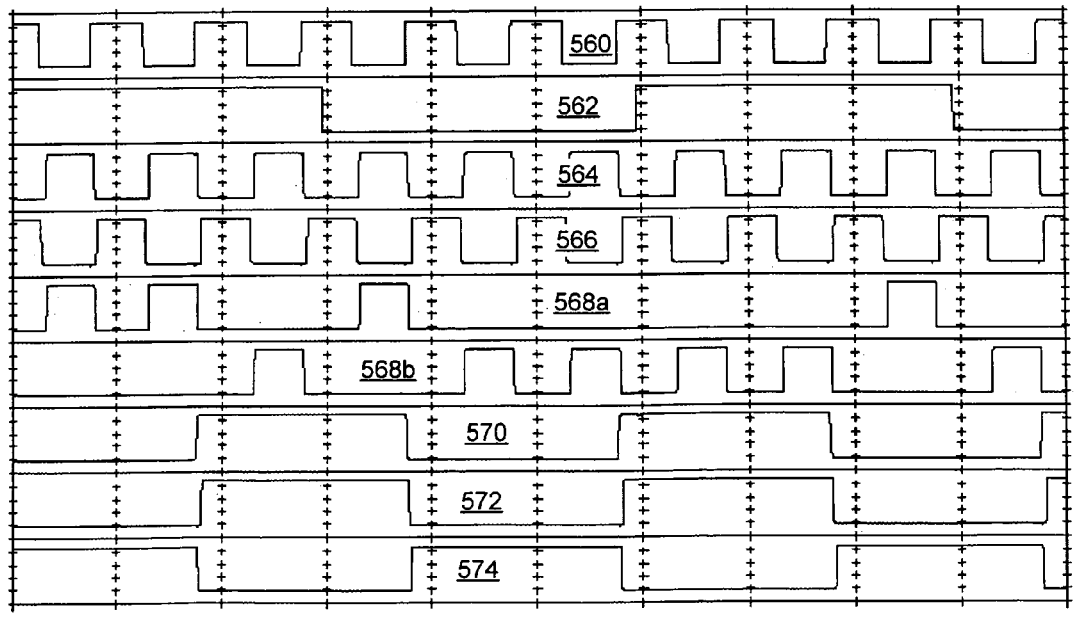

FIG. 5c shows a timing diagram for the circuit of FIG. 5b, in particular CKIN 560, DIN 562 (1110001110 ... ), CK 1564, CK 2566, CK1A 568a, CK1B 568b, CHCK 570, CHCK1 572, CHCK2 574. Note that the senses of CK1A, CK1B are flipped according to CHCK. The desired underlaps depend on logic speed and loading for a particular technology and circuit design.

Figure 6:
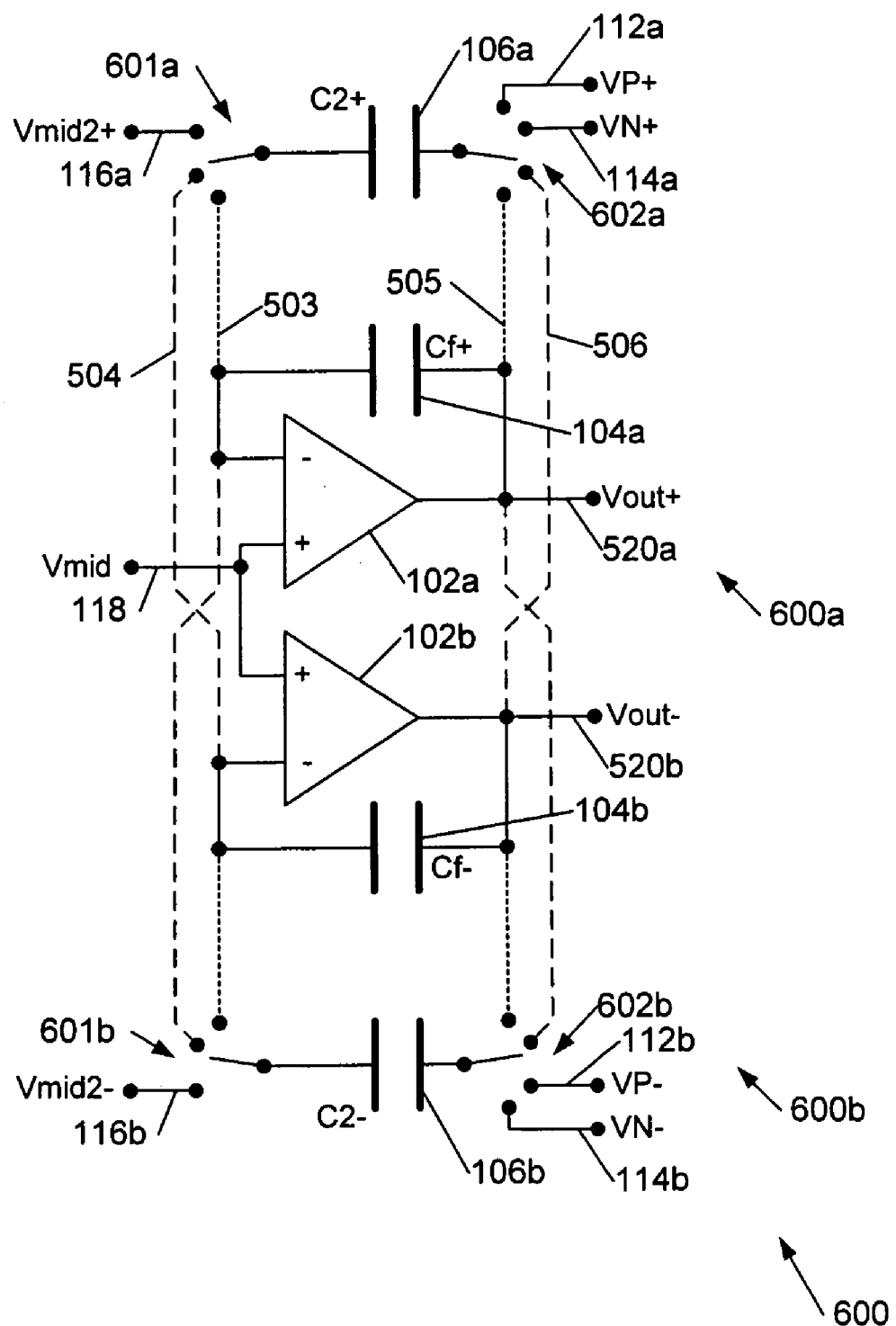
FIG. 6 shows a digital-to-analogue converter (DAC) circuit with means to reduce signal dependent reference loading by simplified chopping connections to the switched capacitors.

FIG. 6 shows a functionally equivalent circuit 600, that operates in essentially the same way, but combines switches 110a and 501a into switch 601a, 108a and 502a into 602a, 110b and 501b into 601b, and 108b and 502b into switch 602b. This gives a circuit with fewer switches, albeit more complex ones. The circuit is designed for use with a modified clocking scheme as defined by Table 6 below.

Figure 4:
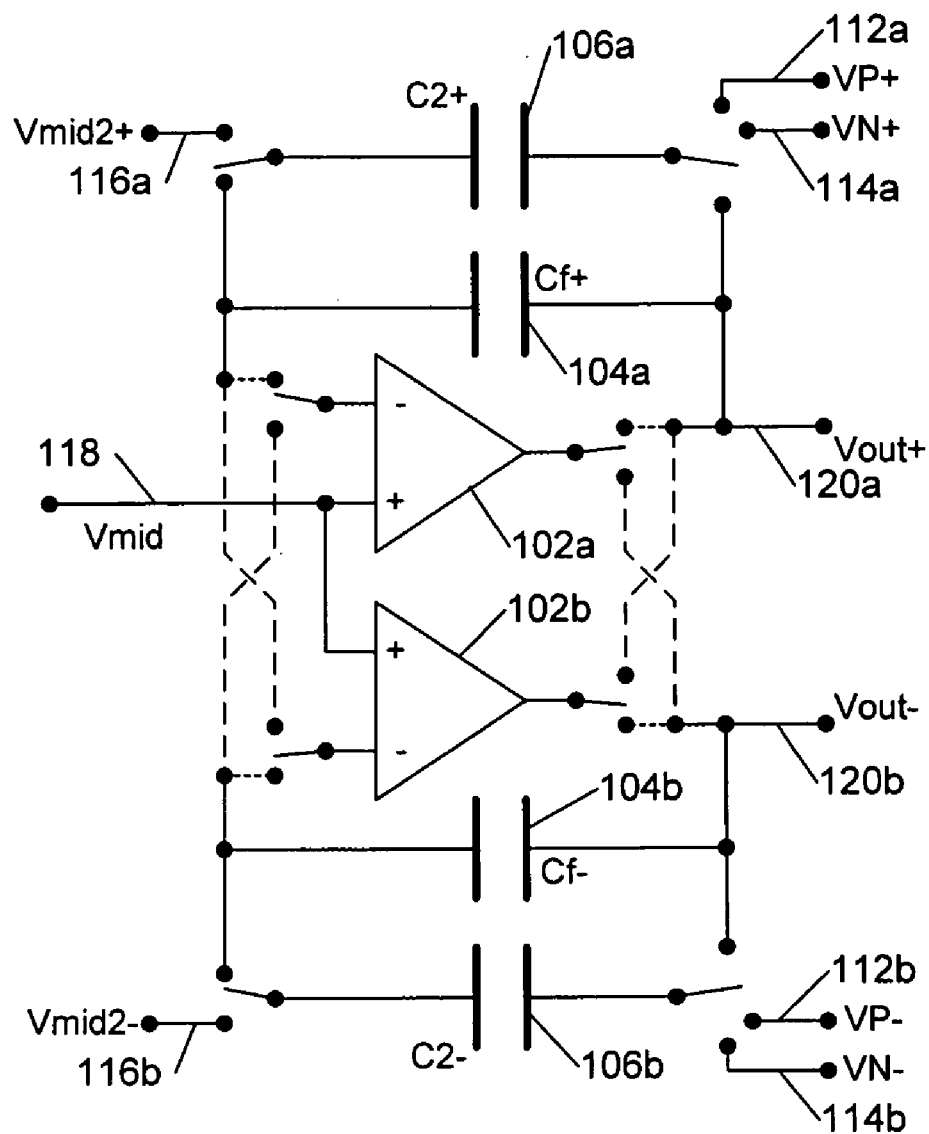
FIG. 4 shows a differential switched capacitor DAC with chopper switching of the operational amplifiers.
Figure 7:
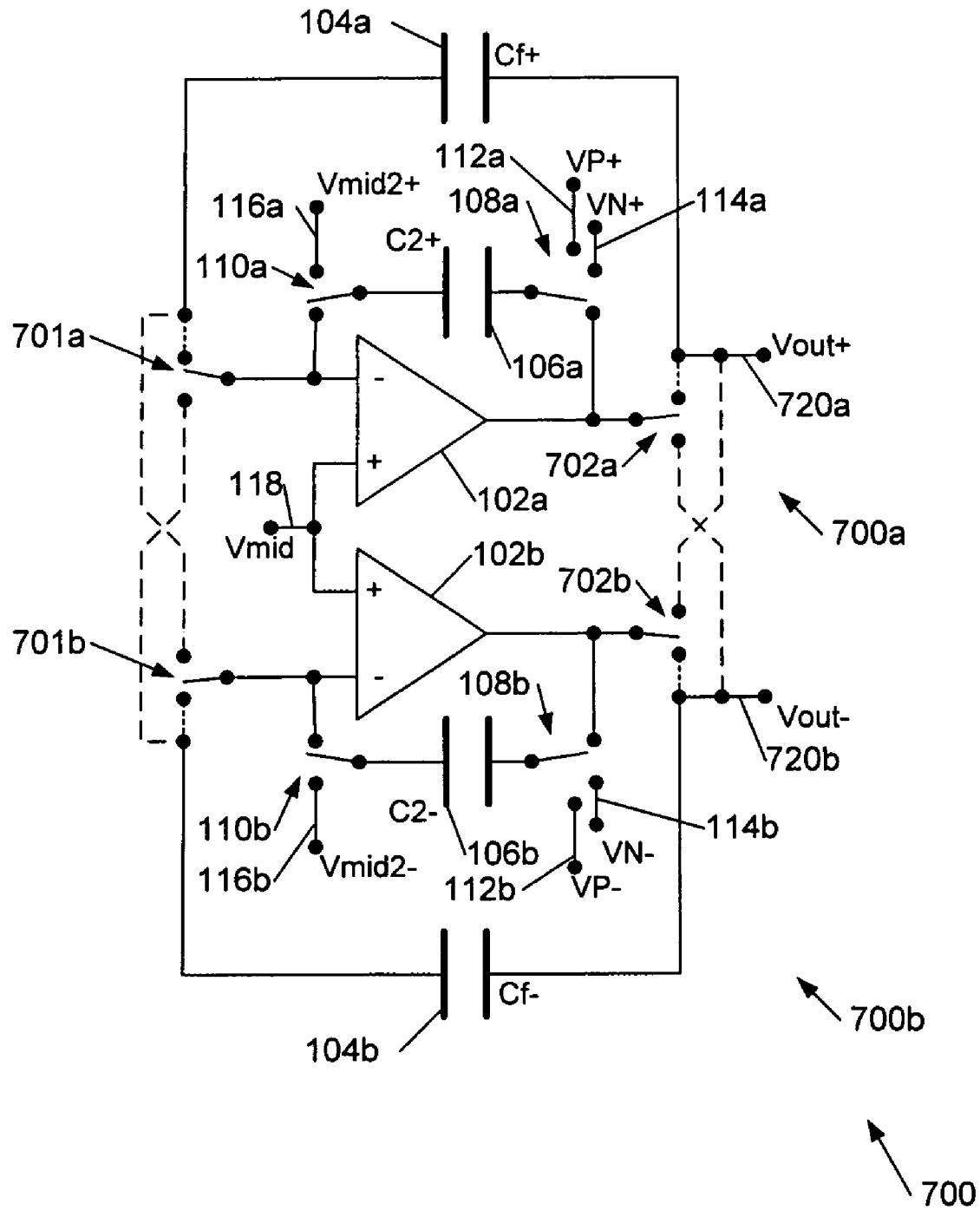
FIG. 7 shows a digital-to-analogue converter (DAC) circuit with chopper connections to op amp and switched-capacitor.

FIG. 7 shows a circuit 700 where both the op amp and the switched capacitor are chopped. As regards the loading of the references, switches 701a, 702a, 701b, and 702b serve the function of switches 601a, 602a, 601b and 602b of FIG. 6 respectively. However chopping the op amp connections gives advantages (as previously discussed with reference to prior art FIG. 4) in terms of rejection of low-frequency modulation of effective input offset voltages, i.e. of flicker noise or power supply coupling, and accomplishes this with no extra switches as compared with the arrangement of FIG. 5.

TABLE 6

Switch positions versus clock phase for an
8-phase clocking scheme for the simplified DAC circuit of FIG. 6

| Switch | Connected to: Phi1 (Charge) | Phi2 (Dump) | Phi3 (Charge) | Phi4 (Dump) | Phi5 (Charge) | Phi6 (Dump) | Phi7 (Charge) | Phi8 (Dump) |
|---|---|---|---|---|---|---|---|---|
| 601a | Vmid2+ | Cf+ | Vmid2+ | Cf+ | Vmid2+ | Cf− | Vmid2+ | Cf− |
| 601b | Vmid2− | Cf− | Vmid2− | Cf− | Vmid2− | Cf+ | Vmid2− | Cf+ |
| 602a | VP+/VN+ | Cf+ | VP+/VN+ | Cf+ | VN+/VP+ | Cf− | VN+/VP+ | Cf− |
| 602b | VN−/VP− | Cf− | VN−/VP− | Cf− | VP−/VN− | Cf+ | VP−/VN− | Cf+ |

In the circuits of FIGS. 5 and 6 it is the switched capacitor which can be regarded as being "chopped" i.e. with connections alternately swapped with the rest of the circuit.

Table 7, below, shows a clocking scheme for the DAC 700 of FIG. 7.

TABLE 7

Switch positions versus clock phase for an
8-phase clocking scheme for the choppered op amp circuit of FIG. 7

| Switch | Connected to: Phi1 (Charge) | Phi2 (Dump) | Phi3 (Charge) | Phi4 (Dump) | Phi5 (Charge) | Phi6 (Dump) | Phi7 (Charge) | Phi8 (Dump) |
|---|---|---|---|---|---|---|---|---|
| 110a | Vmid2+ | 701a | Vmid2+ | 701a | Vmid2+ | 701a | Vmid2+ | 701a |
| 110b | Vmid2− | 701b | Vmid2− | 701b | Vmid2− | 701b | Vmid2− | 701b |
| 108a | VP+/VN+ | 702a | VP+/VN+ | 702a | VN+/VP+ | 702a | VN+/VP+ | 702a |
| 108b | VN−/VP− | 702b | VN−/VP− | 702b | VP−/VN− | 702b | VP−/VN− | 702b |
| 701a | Cf+ | Cf+ | Cf+ | Cf+ | Cf− | Cf− | Cf− | Cf− |
| 701b | Cf− | Cf− | Cf− | Cf− | Cf+ | Cf+ | Cf+ | Cf+ |
| 702a | Cf+ | Cf+ | Cf+ | Cf+ | Cf− | Cf− | Cf− | Cf− |
| 702b | Cf− | Cf− | Cf− | Cf− | Cf+ | Cf+ | Cf+ | Cf+ |

Figure 3:
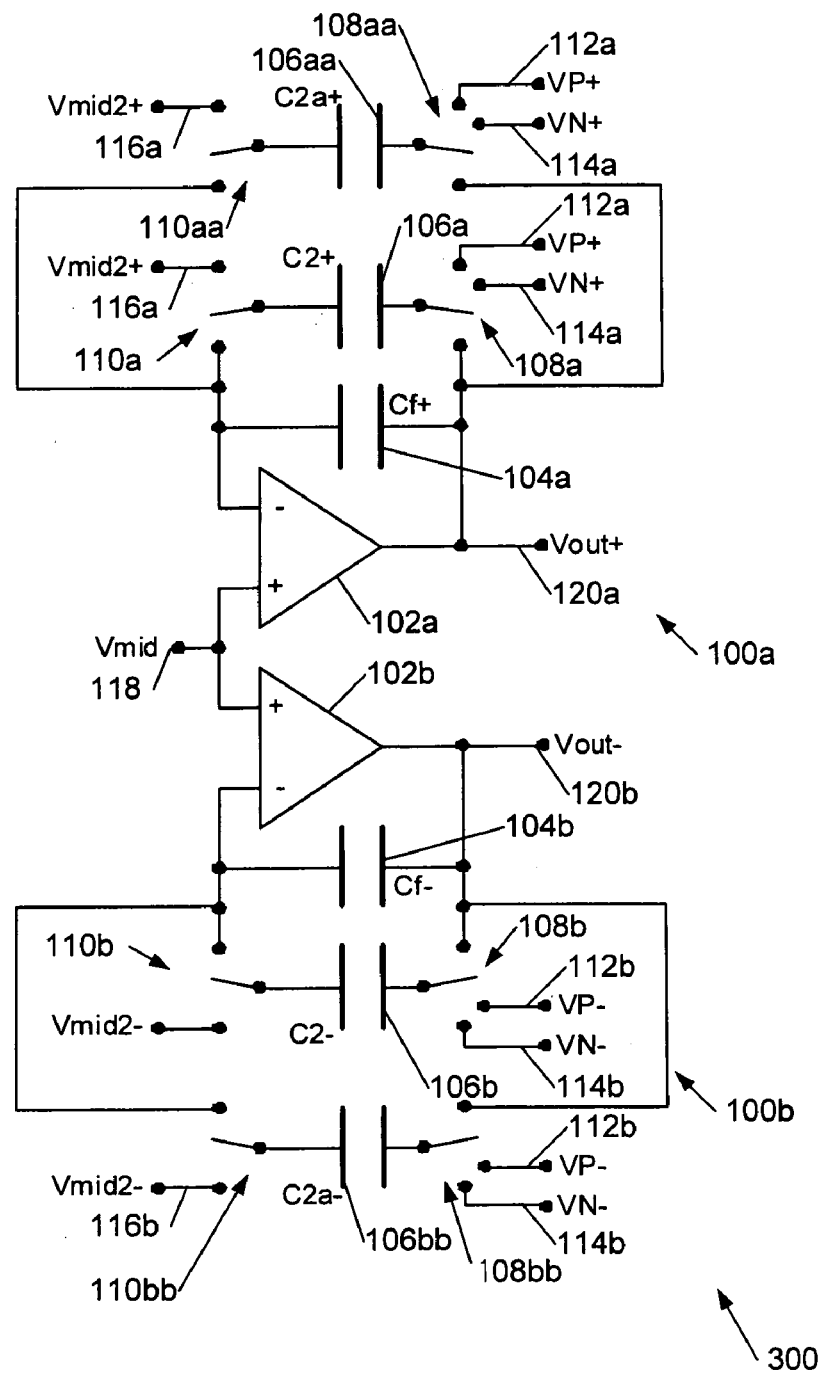
FIG. 3 shows a multi-bit differential switched capacitor DAC according to the prior art.
Figure 8:
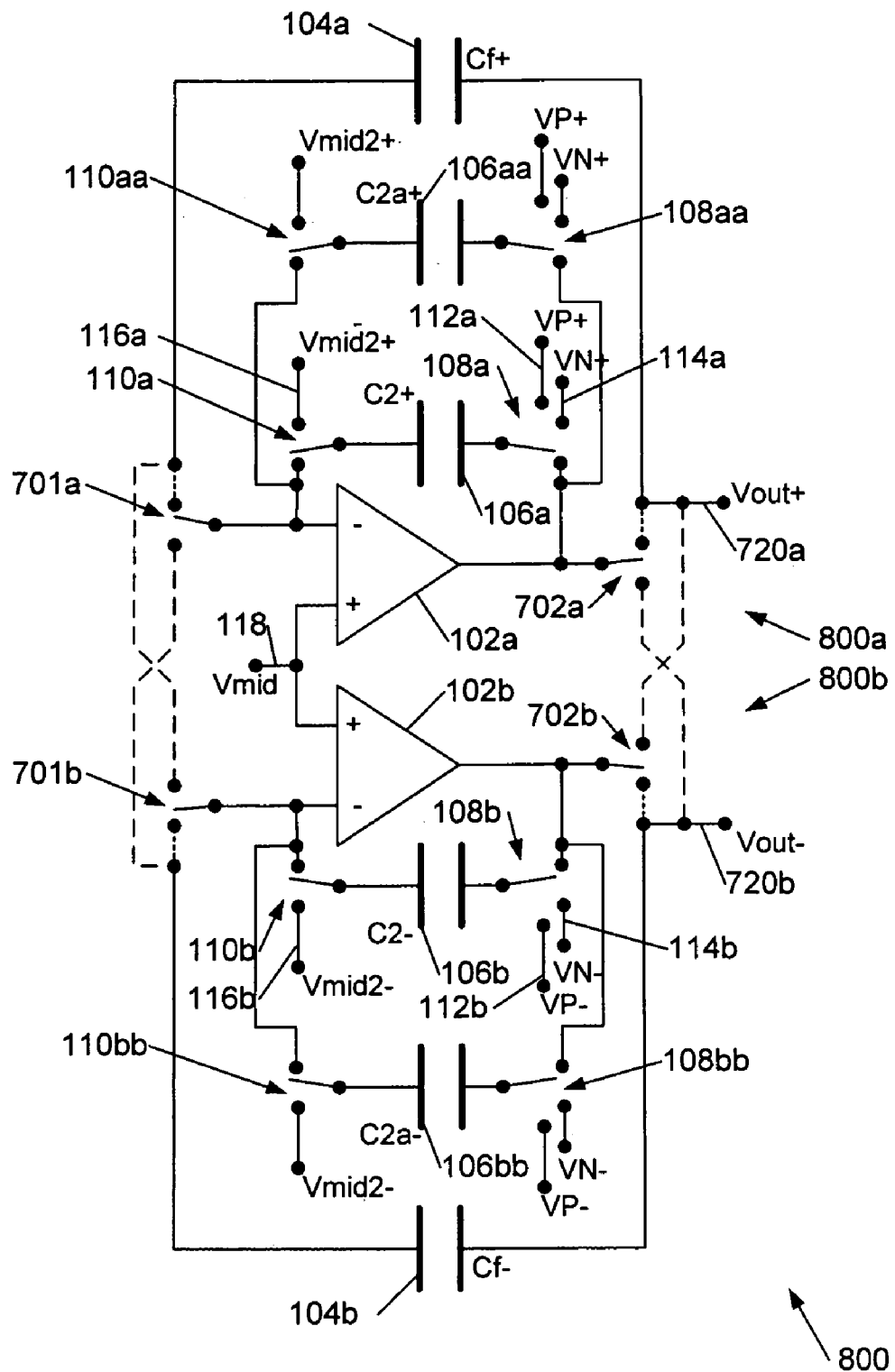
FIG. 8 shows multi-bit extension to the circuit of FIG. 7.

Each of the circuits of FIGS. 5, 6, 7 can be readily extended to multi-bit DACs, as shown by way of example in FIG. 8. Broadly speaking DAC 800 of FIG. 8 represents a modification to the DAC 700 of FIG. 7, in a similar manner to that in which DAC 300 of FIG. 3 represents a modification to DAC 200 of FIG. 2.

Table 8, below, shows a clocking scheme for the DAC 800 of FIG. 8.

higher frequencies. The chopper techniques will frequency-shift any components of charging requirements near to $f_s/4$ down to audio-frequency, giving rise to baseband noise, rather than distortion or cross-talk. An approximate analysis to show this is not a significant problem is as follows.

The total quantisation noise for a one-bit modulator small signal is that of a square wave with amplitude equal to the peak audio signal, i.e. +3 dB above the largest sine wave

TABLE 8

Switch positions versus clock phase for an 8-phase clocking scheme for the op amp choppered, multi-bit DAC circuit of FIG. 8

| Switch | Connected to Phi1 (Charge) | Phi2 (Dump) | Phi3 (Charge) | Phi4 (Dump) | Phi5 (Charge) | Phi6 (Dump) | Phi7 (Charge) | Phi8 (Dump) |
|---|---|---|---|---|---|---|---|---|
| 110a | Vmid2+ | 701a | Vmid2+ | 701a | Vmid2+ | 701a | Vmid2+ | 701a |
| 110b | Vmid2− | 701b | Vmid2− | 701b | Vmid2− | 701b | Vmid2− | 701b |
| 108a | VP+/VN+ | 702a | VP+/VN+ | 702a | VN+/VP+ | 702a | VN+/VP+ | 702a |
| 108b | VN−/VP− | 702b | VN−/VP− | 702b | VP−/VN− | 702b | VP−/VN− | 702b |
| 110aa | Vmid2+ | 701a | Vmid2+ | 701a | Vmid2+ | 701a | Vmid2+ | 701a |
| 110ba | Vmid2− | 701b | Vmid2− | 701b | Vmid2− | 701b | Vmid2− | 701b |
| 108aa | VP+/VN+ | 702a | VP+/VN+ | 702a | VN+/VP+ | 702a | VN+/VP+ | 702a |
| 108ba | VN−/VP− | 702b | VN−/VP− | 702b | VP−/VN− | 702b | VP−/VN− | 702b |
| ... | | | | | | | | |
| 801a | Cf+ | Cf+ | Cf+ | Cf+ | Cf− | Cf− | Cf− | Cf− |
| 801b | Cf− | Cf− | Cf− | Cf− | Cf+ | Cf+ | Cf+ | Cf+ |
| 802a | Cf+ | Cf+ | Cf+ | Cf+ | Cf− | Cf− | Cf− | Cf− |
| 802b | Cf− | Cf− | Cf− | Cf− | Cf+ | Cf+ | Cf+ | Cf+ |

Although FIG. 8 shows just two additional capacitors 106aa,bb and two corresponding additional pairs of switches 108aa,bb, 110aa,bb for each circuit 800a,b (for simplicity), in practice a plurality of additional capacitors may be provided for each differential signal processing circuit portion. Thus, in effect, the switched capacitors C2 of FIG. 6 may be replaced by an array of capacitors. The capacitors in such arrays may or may not be binary weighted. In one embodiment the LSB capacitors are binary weighted, but the MSB capacitors are equally weighted, and used in a random manner to decrease the effects of mismatch. Clock generators for the clocking schemes of Tables 6, 7 and 8 above may be constructed along similar lines to the example clock generator circuit described with reference to FIG. 5b.

As previously mentioned, there are often many capacitors in the banks for a multi-bit coder, for example configured as a binary-weighted array. In this case, the $V_P/V_N$ switching control signals to the large capacitors in the array often change only slowly, following an approximation to the output signal, and only the "LSB" (least significant bit) capacitors show much high-frequency switching activity. In this case it is therefore reasonable to assume that the drive to the biggest capacitors in each bank will be constant over several clock cycles. In such a case the load on $V_P$ due to the largest capacitors should average out to be signal independent and should show little or no frequency-shifted quantisation noise tones. The smaller capacitors will have more high-frequency activity, so these may exhibit such tones but, since they are smaller, the resulting baseband components will also be small. This small amount of high-frequency energy on the $V_P$ and $V_N$ reference inputs is relatively easy to decouple.

The above analysis only deals with the effect of averaged m, corresponding to the audio frequency components of the applied delta-sigma input. However, delta-sigma techniques do not remove quantisation noise, but only move it up to possible (ignoring a small correction due to the practical maximum modulation index being sub-unity). For a well-designed high order modulator, the quantisation noise above the audio bandwidth will be almost flat. This means that the quantisation noise power within an audio bandwidth around say $f_s/4$ will be of the order of that of a +3 dB signal divided by the oversampling ratio, say 64 or 18 dB. The chopper techniques will frequency-shift such $f_s/4$ components of charging requirements down to audio-frequency. Thus the consequent Vref currents, instead of being those due to say a 0 dB sine wave, will be similar to those which would be caused by trying to output a baseband noise signal whose power is only 15 dB down from the 0 dB sine wave, reducing the benefits of the technique. However, for multibit operation, the spectral density of the noise is already suppressed by typically $2^N$ where N is the number of capacitors in the binary array, say 5, giving 30 dB less quantisation energy at $f_s/4$. By comparison multibit operation does not make much difference to the signal-dependent load current in a conventional modulator. So overall (with this example) one could expect 45 dB improvement in audio-band $V_P$ load current variation relative to conventional multibit modulators. This supports the contention that this quantisation noise aliasing effect is not a significant limit on performance.

Strictly speaking the best load averaging will only occur for "random" spectra of the $V_P$ delta-sigma control signals. For example, if the delta-sigma control signals were to have tones close to $f_s/4$, these would appear in the $V_P$ load current, frequency shifted by $f_s/4$ into the low-frequency baseband. For well-designed high-order delta-sigma modulators, such tones are not an issue, but were this to become an issue in future high-performance systems, to reduce the possibility of this effect the "chopping" may be randomised, for example by alternating the switching of each C2 to the positive or negative halves of the differential circuit according to a pseudo-random sequence generated by a pseudo-random sequence generator.

The skilled person will recognise that many variations of the above-described circuits are possible. For example the above-described differential DAC circuits are illustrated using a pair of operational amplifiers 102a,b but the skilled person will recognise that this pair of operational amplifiers may be replaced by a single differential-input, differential-output amplifier.

Although the DAC circuits have been described in the general context of delta-sigma digital control techniques, applications of the circuits are not limited to schemes in which the switching control waveforms are generated by such techniques. For example other digital filter-derived techniques or PWM (pulse width modulation) could be employed or appropriate pulse trains could be retrieved from storage, for example for digital voice or other synthesis.

The skilled person will further recognise that the above-described DAC circuits may be incorporated into other systems. For example one or more of the above-described DAC circuits may be incorporated within a switched-capacitor delta-sigma analogue-to-digital converter, in one or more feedback elements. For example, the skilled person will understand that a delta-sigma analogue-to-digital converter may be constructed by adding, for example, an integrator and a digital filter to one of the above DAC circuits.

No doubt many other effective alternatives will occur to the skilled person and it would be understood that the invention is not limited to the described embodiments and encompasses modifications apparent to those skilled in the art lying within the spirit and scope of the claims appended hereto.

We claim:

1. A differential switched capacitor digital-to-analogue (DAC) circuit comprising first and second differential signal circuit portions for providing respective positive and negative signal outputs with respect to a reference level, and having at least one first reference voltage input and at least one second reference voltage input for receiving respective positive and negative references with respect to said reference level; each of said first and second circuit portions comprising an amplifier with a feedback capacitor, a second capacitor, and a switch to switchably couple said second capacitor to a selected one of said reference voltage inputs to charge the second capacitor and to said feedback capacitor to share charge with the feedback capacitor, and wherein said switch of said first circuit portion is further configured to connect said second capacitor of said first circuit portion to share charge with said feedback capacitor of said second circuit portion, and wherein said switch of said second circuit portion is further configured to connect said second capacitor of said second circuit portion to share charge with said feedback capacitor of said first circuit portion.

2. A differential switched capacitor digital-to-analogue (DAC) circuit as claimed in claim 1 further comprising a switch controller to control said switches of said first and second circuit portions, said switch controller being configured to control each of said switches to perform repeated charge-dump cycles in which each said second capacitor is charged and then shares its charge with a said feedback capacitor, said switch controller being further configured to control said switch of said first circuit portion to alternate, every second of said charge-dump cycles, between connection of said second capacitor of said first circuit portion to share charge with said feedback capacitor of said first circuit portion and connection to share charge with said feedback capacitor of said second circuit portion, and to control said switch of said second circuit portion to alternate, every second of said charge-dump cycles, between connection of said second capacitor of said second circuit portion to share charge with said feedback capacitor of said second circuit portion and connection to share charge with said feedback capacitor of said first circuit portion.

3. A differential switched capacitor digital-to-analogue (DAC) as claimed in claim 2 wherein said switch controller is configured to control said switches to alternate charging of said second capacitor between said first and second reference voltage inputs.

4. A differential switched capacitor digital-to-analogue (DAC) as claimed in claim 3 wherein said switch controller is configured to alternate said second capacitor charging every second of said charge-dump cycles, in synchrony with said charge-sharing alternation.

5. A differential switched capacitor digital-to-analogue (DAC) as claimed in claim 2 wherein said switch controller has a digital signal input, and wherein said switch controller is configured to control said switches to charge said second capacitors responsive to a signal on said digital signal input.

6. A differential switched capacitor digital-to-analogue (DAC) circuit as claimed in claim 1 further comprising a switch controller to control said switches of said first and second circuit portions, said switch controller being configured to control each of said switches to perform repeated charge-dump cycles in which each said second capacitor is charged and then shares its charge with a said feedback capacitor, said switch controller being further configured to control said switch of said first circuit portion to alternate, according to a pseudo-random sequence, between connection of said second capacitor of said first circuit portion to share charge with said feedback capacitor of said first circuit portion and connection to share charge with said feedback capacitor of said second circuit portion, and to control said switch of said second circuit portion to alternate, according to a pseudo-random sequence, between connection of said second capacitor of said second circuit portion to share charge with said feedback capacitor of said second circuit portion and connection to share charge with said feedback capacitor of said first circuit portion.

7. A differential switched capacitor digital-to-analogue (DAC) as claimed in claim 1 further comprising, for each of said first and second circuit portions, a plurality of said second capacitors, each switchably connectable to a selected one of said reference voltage inputs, to said feedback capacitor of said first circuit portion, and to said feedback capacitor of said second circuit portion.

8. A differential switched capacitor digital-to-analogue (DAC) as claimed in claim 1 further comprising an amplifier switch for each of said first and second circuit portions configured to effectively exchange the amplifiers of said first and second circuit portions.

9. A differential switched capacitor circuit comprising positive and negative circuit portions to provide respective positive and negative differential signal outputs based upon positive and negative references, each of said positive and negative circuit portions comprising an operational amplifier with a feedback capacitor and at least one switched capacitor connectable to one of said positive and negative references to store charge and to one of a positive and negative signal node to substantially dump said stored charge to a said feedback capacitor, and wherein said switched capacitors of said positive and negative circuit portions are switched according to an eight phase clocking scheme comprising four successive charge-dump cycles in which said switched capacitors are connected to a said positive signal node for a first pair of said charge-dump cycles and to a said negative signal node for a second pair of said charge-dump cycles.

10. A method of operating a differential digital-to-analogue (DAC) circuit to reduce signal dependent loading of a reference source associated with the DAC circuit, the DAC circuit comprising positive and negative signal processing devices each with a feedback capacitor coupled to a respective positive and negative signal node and a each having a second capacitor switchably couplable to said reference source for charging and to a said signal node for dumping charge to a said feedback capacitor, the method comprising repeatedly:

coupling said second capacitors to said reference source for charging; and coupling said second capacitors to alternate ones of said positive and negative signal nodes for dumping stored charge to a said feedback capacitor;

such that on average over a plurality of charge-dump cycles charge loading of said reference source by said DAC circuit is substantially constant.

11. A method of operating a differential DAC circuit as claimed in claim 10 wherein each of said second capacitors is coupled to an alternate one of said positive and negative signal nodes every second charge-dump cycle.

* * * * *